US 6,567,257 B2

(12) United States Patent  (10) Patent No.: US 6,567,257 B2
Brown  (45) Date of Patent: May 20, 2003

(54) METHOD AND APPARATUS FOR CONDITIONING AN ELECTROSTATIC CHUCK (75) Inventor: Karl Brown, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 107 days.

(21) Appl. No.: 09/836,883

(22) Filed: Apr. 17, 2001

(65) Prior Publication Data
US 2002/0000521 A1 Jan. 3, 2002

Related U.S. Application Data
(60) Provisional application No. 60/198,391, filed on Apr. 19, 2000.

(51) Int. Cl.⁷ ............................................... H01T 23/00
(52) U.S. Cl. ..................................................... 361/234
(58) Field of Search ................. 361/230, 231, 361/233, 234, 212; 279/128

(56) References Cited

U.S. PATENT DOCUMENTS

| 4,667,110 A | 5/1987 | Kariya | 250/492.2 |
| 5,117,121 A | 5/1992 | Watanabe et al. | 307/130 |
| 5,459,632 A | 10/1995 | Birang et al. | 361/234 |
| 5,656,093 A | 8/1997 | Burkhart et al. | 118/728 |
| 5,683,946 A * | 11/1997 | Lu et al. | 437/235 |
| 5,764,471 A | 6/1998 | Burkhart | 361/234 |
| 6,104,595 A | 8/2000 | Brown | 361/212 |

FOREIGN PATENT DOCUMENTS

| JP | 04 100256 | 4/1992 | H01L/21/68 |
| JP | 04 100257 | 4/1992 | H01L/21/68 |
| JP | 05 047910 | 2/1993 | H01L/21/68 |
| JP | 10-189699 | 7/1998 | H01L/21/68 |
| JP | 11 054604 | 2/1999 | H01L/21/68 |
| JP | 11 147051 | 6/1999 | B03C/3/43 |
| JP | 11 233487 | 8/1999 | H01L/21/3065 |
| JP | 11 340308 | 12/1999 | H01L/21/68 |

OTHER PUBLICATIONS

European Search Report from EP 01 30 3560, Dated Sep. 6, 2001.

* cited by examiner

Primary Examiner—Matthew Nguyen
(74) Attorney, Agent, or Firm—Moser, Patterson & Sheridan (57) ABSTRACT A method and apparatus for discharging a residual charge from an electrostatic chuck having one or more electrodes. The discharge process involves exposing a surface of the electrostatic chuck to non-ionized radiation such as photons or microwaves. The discharge apparatus includes a radiation source as part of a semiconductor wafer processing system controlled by a computer. The source of radiation may be lamps such as "bakeout" lamps that are generally located within the process chamber. Radiation from the lamps excite certain dopant atoms within the chuck material causing the material to exhibit the photoconductive effect. Such a photoconductive state allows any residual charge on the surface of the chuck to be conducted away through the chuck electrodes even as the chuck cools to temperatures that do not promote such charge migration.

18 Claims, 5 Drawing Sheets

METHOD AND APPARATUS FOR CONDITIONING AN ELECTROSTATIC CHUCK

This invention claims the benefit of U.S. Provisional Patent Application Ser. No. 60/198,391 filed Apr. 19, 2000, which is hereby incorporated by reference.

BACKGROUND OF THE DISCLOSURE

1. Field of the Invention

The invention relates to semiconductor wafer processing systems and, more particularly, the invention relates to a method and apparatus for conditioning an electrostatic chuck used to retain a semiconductor wafer after a maintenance cycle.

2. Description of the Background Art

Electrostatic chucks are used for holding a workpiece in various applications ranging from holding a sheet of paper in a computer graphics plotter to holding a semiconductor wafer within a semiconductor wafer processing system. Although electrostatic chucks vary in design, they all are based on the principal of applying a voltage to one or more electrodes embedded in the chuck so as to induce opposite polarity charges in the workpiece and electrode(s), respectively. The electrostatic attractive force between the opposite charges pulls the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. Another conventional solution, which purportedly removes the charge more quickly, is to reverse the polarity of DC voltage applied to the electrodes. This technique is described in the context of a chuck having two electrodes (a bipolar chuck) in U.S. Pat. No. 5,117,121 issued May 26, 1992 to Watanabe, et al.

A shortcoming that has been observed with these conventional approaches to removing the electric charge is that they fail to completely remove the charge, so that some electrostatic force remains between the workpiece and the chuck. This residual electrostatic force necessitates the use of a large mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck unpredictably into a position from which it is difficult to retrieve using a conventional wafer transport robot.

This accumulation of the residual charge is also detrimental to chucking of a subsequent wafer. The accumulated charge interferes with the chucking voltage by either being additive, if the accumulated charge has the same polarity as the chucking voltage, or is subtractive, if the accumulated charge has an opposite polarity as the chucking voltage.

To decrease the residual charge, the chuck can be utilized at high temperatures. In certain ceramic chucks, using the chuck at a higher temperature (e.g., greater than 200° C.) makes the chuck material more conductive. As such, some of the residual charge will dissipate by conduction through the chuck to the electrodes as long as the chuck is maintained at the high temperature. Additionally, a plasma cleaning step may be performed after wafer processing occurs. Typically, an inert gas (e.g., Argon) is introduced into a chamber containing the electrostatic chuck. The plasma is ionized thus forming a conductive path from the electrostatic chuck surface (containing the residual charges) and a grounded chamber component (e.g., a chamber wall or the like). The ions bombard the electrostatic chuck surface thereby dislodging the residual charges. The charges then move through the plasma to ground. Reactive species (e.g., oxygen or hydrogen may also be used). The plasma cleaning step also induces high temperatures in the electrostatic chucks to further dissipate the residual charges.

Unfortunately, the dissipating effect of the high temperature maintenance process (either by direct heating or plasma processing) is greatly reduced as the chuck begins to cool and is prepared for wafer processing. Therefore, there is a need in the art for a method to retain the effect of dissipating residual charges after the maintenance cycle ends (during a cooldown period).

SUMMARY OF THE INVENTION

The disadvantages of the prior art are overcome by the present invention of a method and apparatus for conditioning a residual charge from an electrostatic chuck. The conditioning process involves exposing the surface of an electrostatic chuck to a source of energy that bombards the surface with non-ionized radiation, e.g., photons or microwaves. The electrostatic chuck can be any form of chuck having one or more electrodes embedded into a dielectric body. Preferably, the dielectric body is fabricated from a material having a relatively low resistivity (i.e., the material is semiconductive) such as aluminum nitride. Such material contains donor atoms that can be excited to enhance conductivity of the material. In one embodiment of the invention, the conductivity of the chuck material is promoted by exposing the surface of the chuck to photons from a lamp or lamps. After exciting the material, the residual charge on the chuck surface is substantially reduced.

To discharge the electrostatic chuck in accordance with the present invention, bake out lamps located in the process chamber are turned on after each wafer is removed from the chamber and the surface of the chuck is exposed to illumination that discharges the surface.

Additionally, by using the illumination process of the present invention to remove the residual charge rather than relying on an electrostatic chuck being used at high temperatures only, electrostatic chucks that heretofore were expected to have a minimum temperature of 150 degrees C. can now be used at much lower temperatures, e.g., −40−+25 degrees C.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
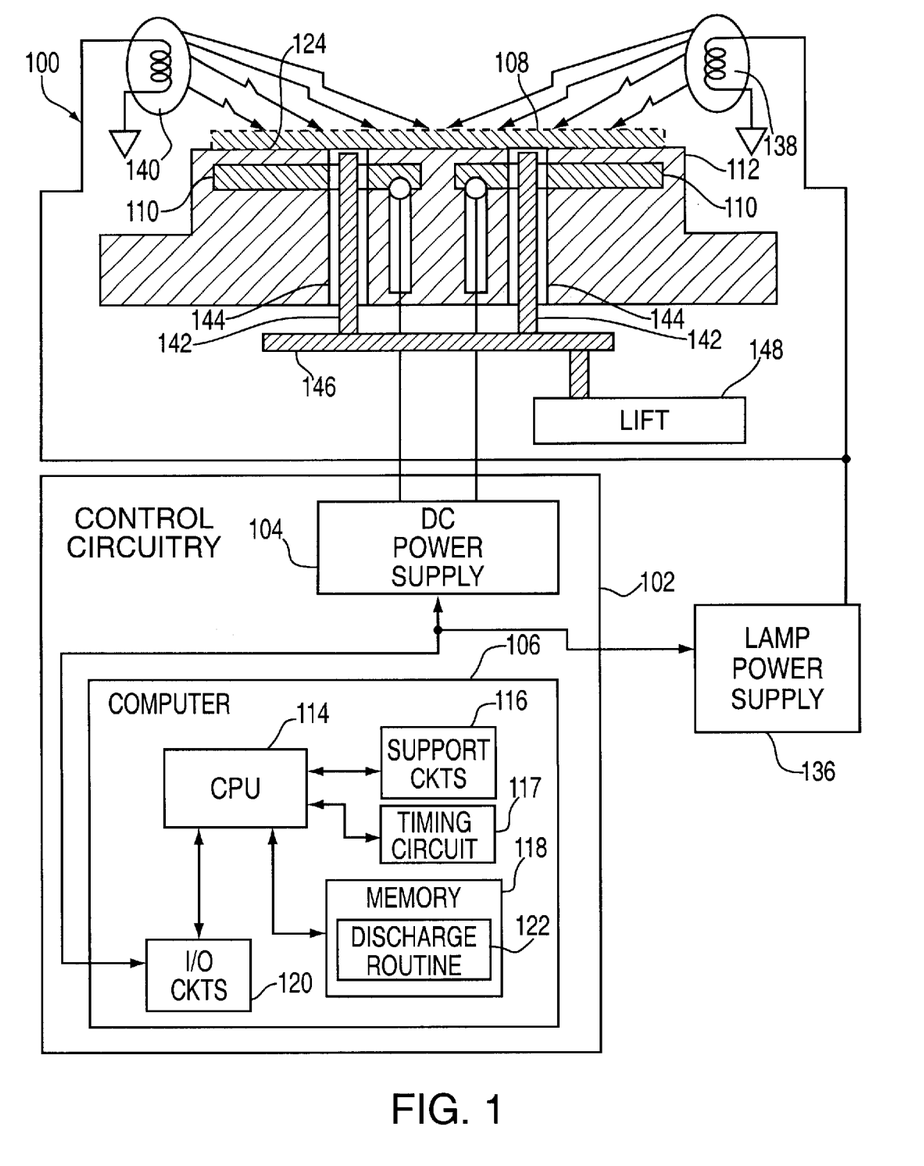
FIG. 1 depicts a sectional view, partially in schematic form, of a conventional electrostatic chuck coupled to a general purpose computer that is programmed to execute the method of the present invention.

FIG. 1 schematically depicts an electrostatic chuck 100 coupled to control circuitry 102. The electrostatic chuck 100 that is depicted is a bipolar chuck having a pair of coplanar electrodes 110 embedded within a dielectric body 112 that forms a support surface 124 upon which the chuck retains a workpiece 108, e.g., a semiconductor wafer (shown in phantom). Although a bipolar chuck is depicted, those skilled in the art will realize from the following discussion that the present invention may be used with any type of electrostatic chuck, including monopolar chucks, dielectric chucks, ceramic chucks, and the like.

To take advantage of the invention, the chuck 100 must be fabricated of a material that can be excited into a conductive state or a semiconductive state when exposed to radiation, e.g., the material must experience a photoconductive effect. Such a chuck material includes aluminum nitride containing dopants such as oxygen or other impurities. This semiconducting form of electrostatic chucks are generally known as Johnsen-Rahbek (J-R) chucks because they rely on the Johnsen-Rahbek effect to provide a substantial chucking force between a wafer and the chuck surface. An aluminum nitride J-R chuck is available as, for example, the MCA electrostatic chuck manufactured by Applied Materials Inc. of Santa Clara, Calif. The MCA electrostatic chuck is disclosed in commonly assigned U.S. Pat. No. 5,656,093 issued to Burkhart et al. on Aug. 12, 1997 and incorporated herein by reference.

The chuck 100 has positioned proximate its surface 124 one or more radiation sources, e.g., lamps 138 and 140. The radiation sources provide non-ionized radiation (e.g., photons or microwaves) to the chuck material to excite certain dopant atoms such as oxygen to cause the material to become semiconductive, i.e., to experience the photoconductive effect. Such a photoconductive state will continue to discharge any residual charge on the surface of the chuck after heating the electrostatic chuck via a post wafer processing maintenance step such as direct heating or plasma cleaning or using the chuck at an elevated temperature (>200° C.) during wafer processing. The residual charge will discharge into the electrodes 110 or, at a minimum, the residual charges will migrate away from the chuck surface such that the surface charge density is substantially reduced. Since the aluminum nitride is optically transparent with respect to visible light at the depth of the electrodes, the photoconductive effect is generally a bulk process that causes the entire chuck to become semiconductive upon illumination. Therefore, the chuck is "pre-conditioned" to have reduced charge density prior to operation (e.g., chucking a new wafer and processing same).

The control circuitry 102 of the electrostatic chuck 100 contains a DC power supply 104 and a lamp power supply 136 that are each controlled by a computer 106. The DC power supply 104 produces variable positive and negative voltages for each electrode of the bipolar chuck to chuck and dechuck the semiconductor wafers 108 in a manner that is well known in the art. The lamp power supply 136 provides a 120 volt lamp voltage that controls the intensity of the lamps 138 and 140.

The wafer 108 is raised and lowered with respect to the chuck surface by several (preferably four but at least three) lift pins 142. Each lift pin 142 slides in a corresponding bore 144 in the body 112 of the chuck 180. All the lift pins 142 are mounted on a carriage 146 that is raised and lowered by a pneumatic lift mechanism 148. The lift mechanism is controlled by signals from the computer 106 via 110 circuits 120.

To control the retention of a wafer 108, the computer 106 sets the output voltage value of the DC power supply 104 to chuck/dechuck the wafer 108 and illuminates the lamps 138 and 140 when the wafer 108 has been removed from the chuck surface 124. The computer 106 is a general purpose, programmable computer system containing a central processing unit (CPU) 114 connected to conventional support circuits 116 such as a power supply, cache, memory, timing circuits, and the like. In addition, the CPU is connected to a timing circuit 117 and memory circuits 118 such as read-only memory (ROM) and random access memory (RAM). The present invention can be implemented as a software program stored in memory 118 as chuck discharge routine 122. Upon execution of this discharging routine, the computer system becomes an apparatus used for discharging the electrostatic chuck. In practice, this discharge routine 122 would be a subroutine of a general chucking and dechucking software routine, where the discharging subroutine is executed after the wafer is dechucked and removed from the chuck and before the next wafer is placed on the chuck surface and chucked. Alternately, a second subroutine could be executed to operate the lamps after a chuck maintenance cycle.

Figure 2:
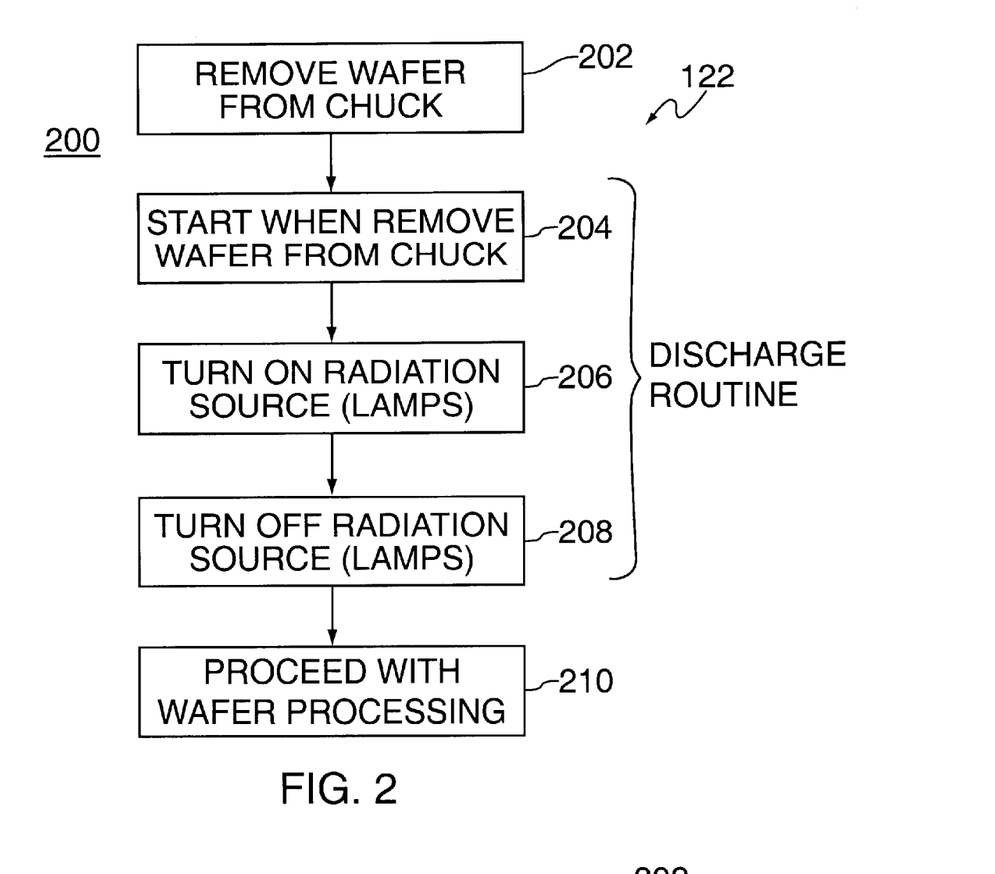
FIG. 2 depicts a flow diagram of the method of the present invention.

FIG. 2 depicts a flow diagram that represents a first embodiment of the discharge routine 122 of the present invention. The routine 122 is generally executed, as an interrupt routine that executes every time a wafer is removed from the chuck during a wafer processing routine 200. At step 202 of the wafer processing routine 200, a wafer is removed from the chuck 100. For example, the wafer can be removed by applying a "dechucking" voltage from the D.C. power supply 104 to the chuck electrodes 110. Preferably, the dechucking voltage has a polarity opposite to that of any electrostatic charge held in the dielectric body 112. The dechucking voltage induces a charge in the electrodes 110 which balances the charge held in the dielectric and minimizes the electrostatic attractive force between the chuck 100 and the wafer. The "dechucking" voltage has for example, the same polarity as that applied to the electrodes 110 by the D.C. power supply 104 to retain the workpiece at a different magnitude. The wafer is then physically removed by, for example, raising the lift pins 142. Alternatively, the dechucking voltage can be either zero or of a polarity opposite that of the chucking (i.e. retaining) voltage.

The discharge routine 122 begins at step 204 with the wafer removed from the chuck 100. At step 206, the radiation source (the lamps) are turned on to illuminate the chuck surface for 5 seconds to a few minutes. During this time, the chuck is cooling and then remaining idle in a steady state temperature condition yet still is capable of discharging residual charge. After a sufficient period of time has elapsed, as determined by the timing circuit 117, the radiation source is turned off at step 208, i.e., the residual charge is now discharged. At step 210, the wafer processing routine 200 proceeds with wafer processing, i.e., another wafer is placed on the chuck surface 124, and is chucked and subsequently processed. The routine 122 may be executed after each wafer is removed from the chuck, or may be executed on a periodic basis (e.g., every Nth wafer) depending upon the amount of charge accumulated during each wafer processing cycle.

Figure 6:
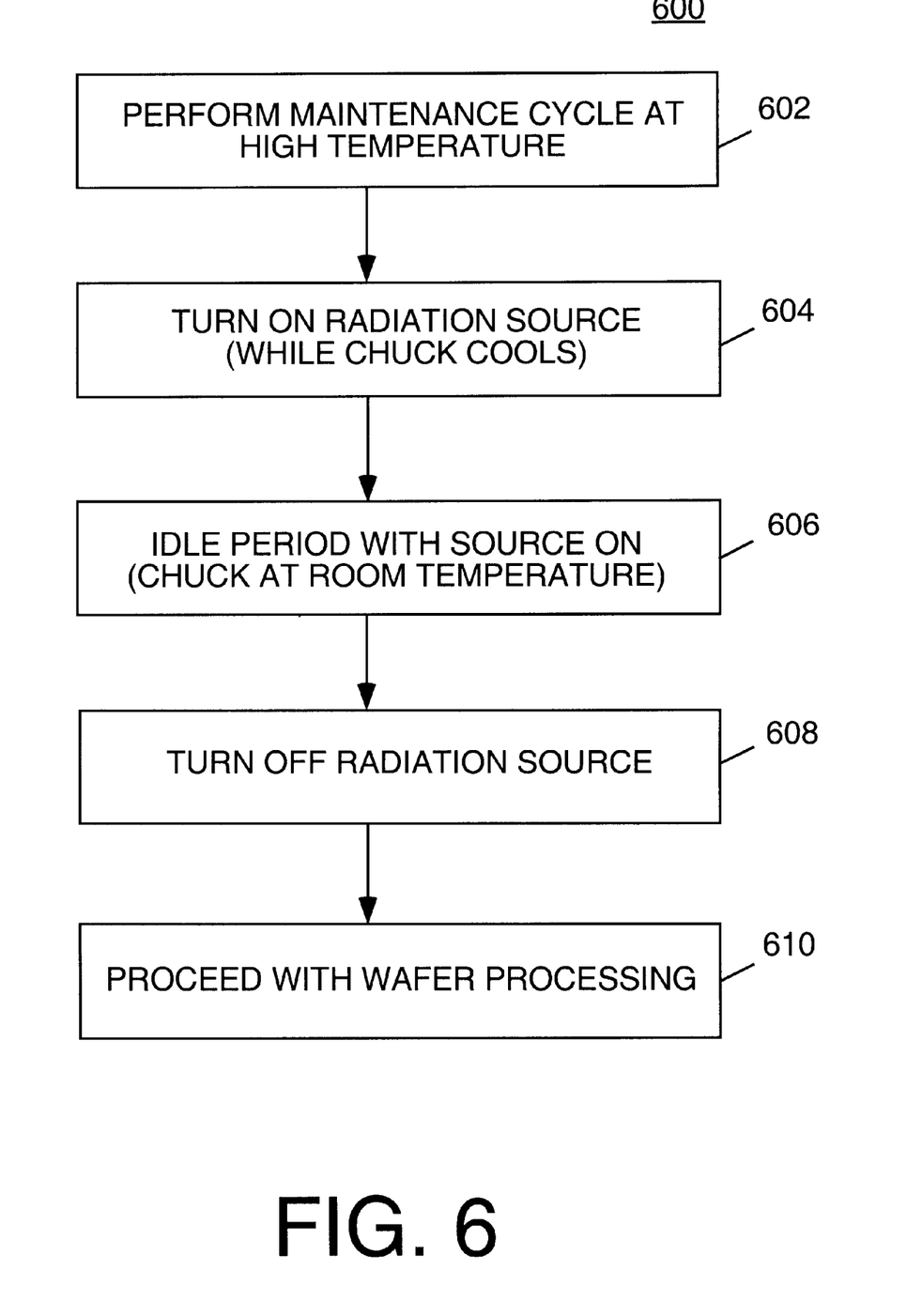
FIG. 6 depicts a flow diagram of the method of the present invention.

In a second illustrative embodiment of the invention, the bake out lamps of a physical vapor deposition (PVD) chamber have been used to illuminate an electrostatic chuck and remove the residual charge therefrom after a maintenance cycle. Specifically, FIG. 6 depicts a method 600 comprising a series of method steps for practicing such an embodiment. The method 600 starts at step 602 wherein a typical electrostatic chuck maintenance cycle is conducted (e.g. a high temperature bakeout of a processing chamber containing the chuck). Such maintenance cycle for example elevates the chamber temperature to 350 C. when a previously performed wafer processing step was conducted at chamber temperatures above 200 C. At step 604, the chuck begins to cool down and a radiation source is turned on thereby exposing the chuck to non-ionized radiation (e.g. photons or microwaves). The lamps remain on as the chuck cools from 350 C. to approximately room temperature (approx. 18 C.). This cooldown period is in the range of approximately 1–2 hrs. After the chuck has adequately cooled, an idle period is executed at step 606. The idle step continues to expose the chuck to the radiation for added beneficial charge dissipation. In a preferred embodiment of the invention, the idle step is conducted for approximately 30 minutes. At step 608, the radiation source is turned off. At step 610, the chuck is ready for continued wafer processing having been put through the proper maintenance cycle and preconditioning sequence to eliminate residual charges.

Figure 3:
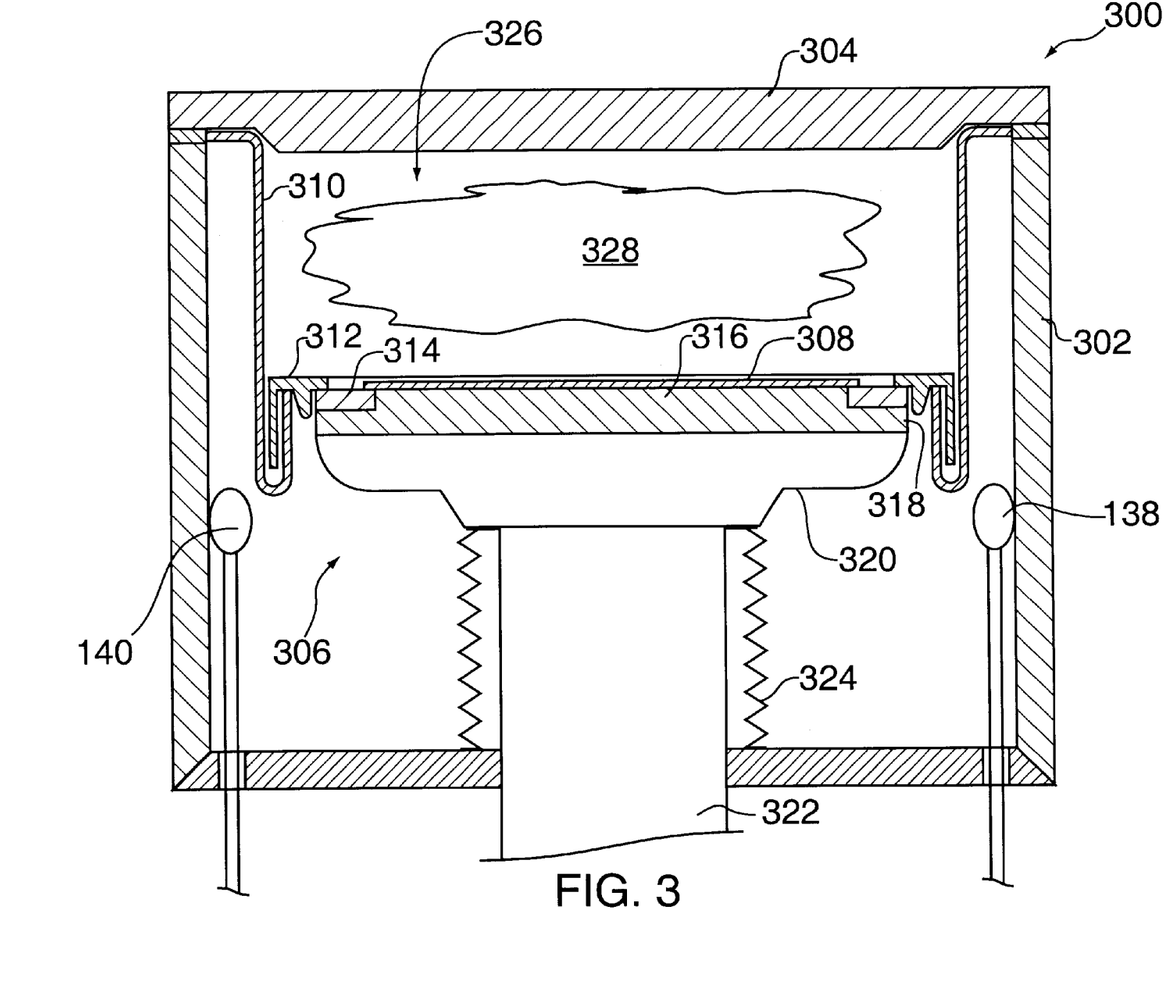
FIG. 3 depicts a semiconductor wafer processing system that is operated in accordance with the present invention having the pedestal in the processing position.

FIG. 3 depicts a cross-sectional, schematic view of a physical vapor deposition (PVD) chamber 300 incorporating the present invention. The chamber 300 contains an enclosure 302 and a target 304 which define a volume within which a pedestal 306 supports a semiconductor wafer 308. A plasma zone 326 is defined by a cylindrical shield 310 which supports a shadow ring 312 that rests upon a waste ring 314. The waste ring 314 is supported by an electrostatic chuck 316. The waste ring 314 rests upon a flange 318 extending circumferentially from the edge of the electrostatic chuck 316. The chuck is attached generally by a peripheral clamp, brazing, or bolts to a pedestal base 320. The base 320 is connected to a shaft 322 which is sealed from the environment of the chamber by bellows 324. The bellows are sealed to the bottom of the chamber enclosure 302 and also the support 320 at each end of the bellows.

FIG. 3 depicts the system having the pedestal 306 in a process position, that is, with the pedestal raised to have the waste ring 314 engage the shadow ring 312. In this position, a plasma 328 is formed above the wafer 308 and the target 304 is sputtered to deposit material onto the wafer 308. The wafer 308 is retained by an electrostatic force between the wafer 308 and the electrostatic chuck 316. In this process position, the bake out lamps 138 and 140 are generally off.

Figure 4:
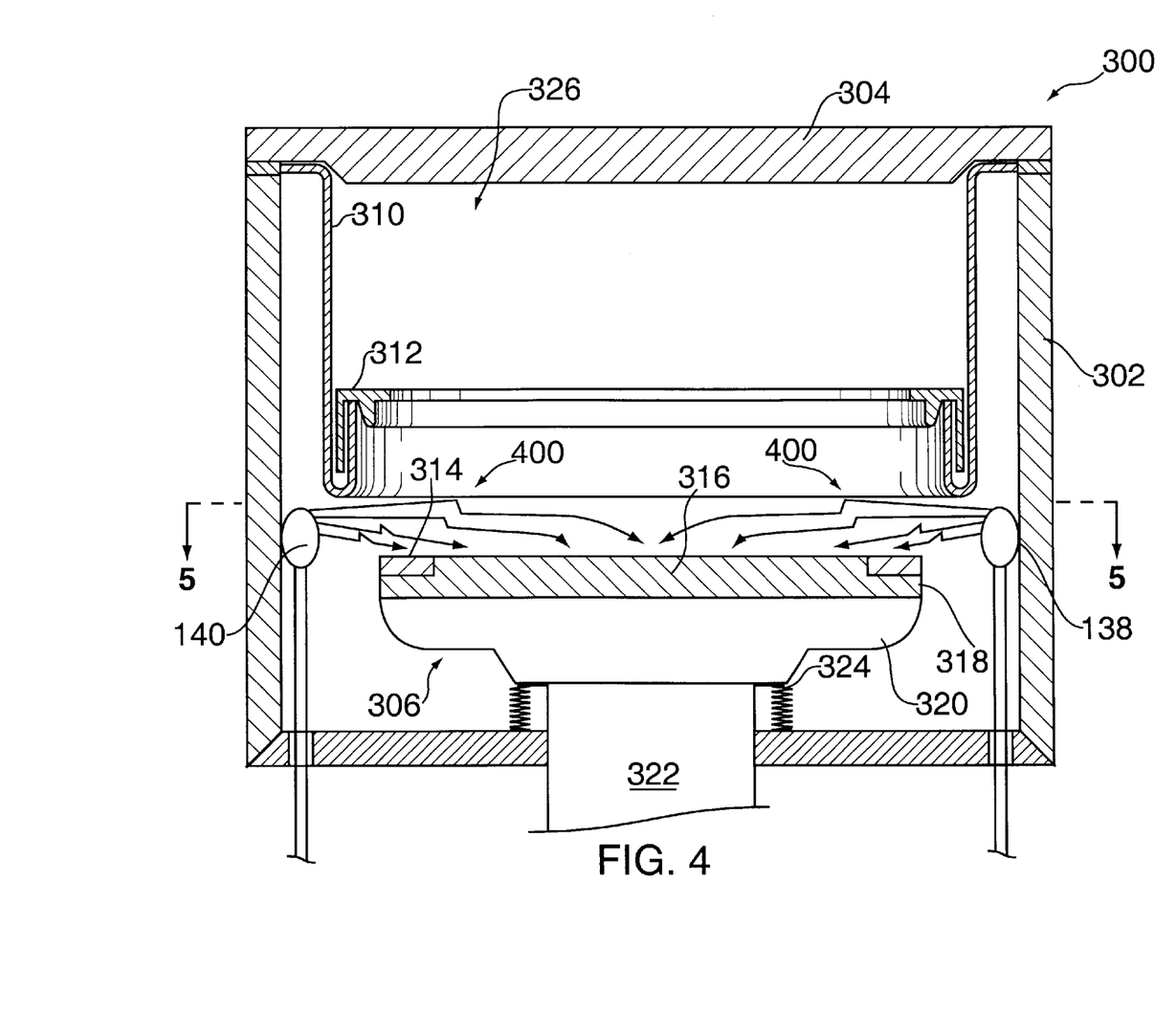
FIG. 4 depicts a semiconductor wafer processing system that is operated in accordance with the present invention having the pedestal in the discharge position.

FIG. 4 depicts the system in a wafer removal position, where the pedestal 306 has been lowered to allow a wafer transport robot (not shown) to access the chamber 302 through a slit valve (not shown). From this position, the wafer is dechucked by the chucking power supply (104 in FIG. 1) using any one of the many wafer dechucking methods available in the art. Once the wafer is removed and before the next wafer is placed on the chuck, the lamps 138 and 140 are turned on. The lamps are generally activated by virtue of a signal sent by a controller to a relay in response to a signal provided to the controller from a robot position sensor indicative of removal of the wafer from the pedestal. Once activated, the lamps illuminate the surface of the chuck as indicated by arrows 400. In about 5 seconds to a few minutes, the photons cause a photoconductive effect that discharges any residual charge remaining on the chuck 316. The duration of illumination is selected to be sufficient to reduce/remove residual charge but minimize the impact on wafer throughput through the chamber. The duration is preferably controlled by a controller timer circuit, but may also be controlled by a signal from the controller to the lamp relay which extinguishes the lamps in response to the positioning of a new wafer at a selected position vis-à-vis the pedestal. Likewise, the extinguish signal could be sent in response to a signal indicative of reduced/eliminated accumulated charge on the electrostatic chuck. Thereafter, the next wafer can be positioned upon the chuck 316 and the pedestal 306 raised into the processing position. Alternatively, the lamps may be continuously illuminated such that the chuck is exposed to the light from the lamps whenever the chuck is lowered as shown in FIG. 4. In this manner, the chuck is automatically discharged during each wafer transfer.

Figure 5:
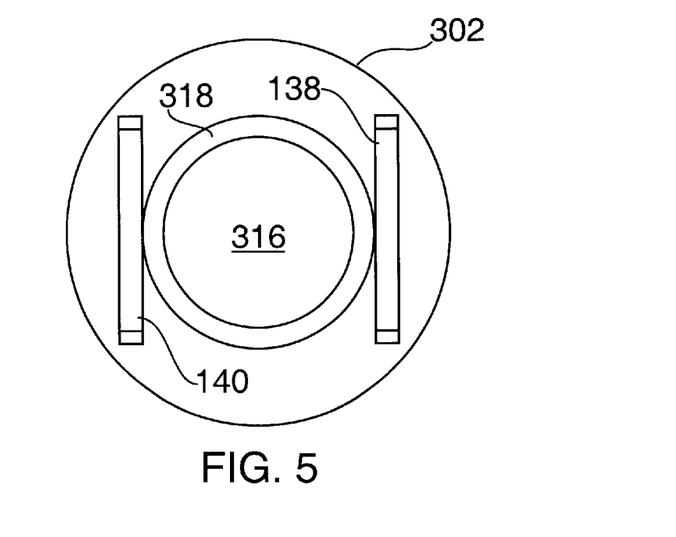
FIG. 5 depicts a top schematic view of a chamber 300 taken along line 5—5 of FIG. 4.

FIG. 5 depicts a top schematic view of the chamber 300 taken along line 5—5 of FIG. 4. The lamps 138 and 140 are mounted lengthwise along the side of the chamber wall 302. The lamps 138 and 140 are, for example, tungsten filament halogen lamps having a 500 watt rating and a length of about 8.7 inches and a diameter of 16 mm. One exemplary lamp is model 10P-500W120V-T3-TB (598850-0) lamp manufactured by Sylvania. These particular lamps are designed as bake out lamps and, as such, produce high intensity infrared radiation. For the methods described, these lamps are usually run at about 90% of their rated power. To increase the energy of the photons that impact the electrostatic chuck 316, different lamps can be used to provide a light spectrum that is in the visible or ultra-violet range. As such, an increase in the photoconductive effect is possible and the discharge occurs rather quickly. Furthermore, a supplemental source of illumination, such as an ultra-violet (UV) lamp may be used in conjunction with the bakeout lamps. Such supplemental illumination can be mounted either inside or outside the chamber 300.

By using the illumination process of the present invention to remove the residual charge rather than relying on an electrostatic chuck being used at high temperatures only, electrostatic chucks that heretofore were expected to have a minimum temperature of 150 degrees C. can now be used at much lower temperatures, e.g., as low as −40° C.

Also, the invention can be used in conjunction with any wafer support (i.e., not only an electrostatic chuck) that contains material that experiences the photoconductive effect. Such supports include ceramic heaters and the like.

Although various embodiments which incorporate the teachings of the present invention have been shown and described in detail herein, those skilled in the art can readily devise many other varied embodiments that still incorporate these teachings.

What is claimed is:

1. A method of conditioning an electrostatic chuck comprising the steps of:
   (a) performing a high temperature maintenance cycle process upon said electrostatic chuck;
   (b) exposing said electrostatic chuck to radiation after said high temperature maintenance cycle process; and
   (c) performing an idling step.

2. The method of claim 1, wherein the portion of time during which the wafer chuck is exposed to the radiation is at least five minutes.

3. The method of claim 1, the idling step further comprises prolonging exposure of the electrostatic chuck to the radiation.

4. The method of claim 1, wherein said radiation is provided by at least one lamp.

5. The method of claim 4, wherein said lamps have at least a 500 watt rating.

6. The method of claim 4, wherein said lamps are of the halogen type.

7. The method of claim 1, wherein the high temperature maintenance cycle process is performed at a temperature of about 350° C.

8. The method of claim 1, wherein the radiation is in the form of photons.

9. The method of claim 1, wherein the idling step further comprises a discharging step whereby any residual charges that reside on the surface of the electrostatic chuck are discharged via at least one electrode.

10. In a system for processing waters having a semiconductor processing chamber, a computer readable medium in a general purpose computer system that operates as a special purpose controller when executing a conditioning program comprising the steps of:
   (a) performing a high temperature bakeout process upon said electrostatic chuck;
   (b) exposing said electrostatic chuck to radiation after said high temperature bakeout process; and
   (c) performing an idling step.

11. The computer readable medium of claim 10, wherein the high temperature bakeout process step is conducted at a temperature of about 350° C.

12. The computer readable medium of claim 10, wherein step (b) is performed for at least five minutes.

13. The computer readable medium of claim 10, wherein the idling step further comprises prolonging exposure of the electrostatic chuck to the radiation.

14. The computer readable medium of claim 10, wherein the radiation source further comprises at least one lamp.

15. The computer readable medium of claim 13, wherein said lamps have at least a 500 watt rating.

16. The computer readable medium of claim 13, wherein said lamps are of the halogen type.

17. The apparatus of claim 10, wherein the radiation is in the form of photons.

18. The apparatus of claim 10, wherein the idling step further comprises allowing the electrostatic chuck to cool down.

* * * * *

UNITED STATES PATENT AND TRADEMARK OFFICE
CERTIFICATE OF CORRECTION

PATENT NO. : 6,567,257 B2
DATED : May 20, 2003
INVENTOR(S) : Brown

It is certified that error appears in the above-identified patent and that said Letters Patent is hereby corrected as shown below:

<u>Column 7,</u>
Line 15, please change "waters" to -- wafers --.

Signed and Sealed this

Ninth Day of December, 2003

JAMES E. ROGAN
*Director of the United States Patent and Trademark Office*